United States Patent
Wu

(10) Patent No.: US 8,736,078 B2
(45) Date of Patent: May 27, 2014

(54) CHIP PACKAGE AND METHOD FOR ASSEMBLING CHIP PACKAGE

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 24 days.

(21) Appl. No.: 13/534,247

(22) Filed: Jun. 27, 2012

(65) Prior Publication Data

US 2013/0277847 A1 Oct. 24, 2013

(30) Foreign Application Priority Data

Apr. 18, 2012 (TW) .............................. 101113862 A

(51) Int. Cl.
*H01L 23/48* (2006.01)
*H01L 23/52* (2006.01)
*H01L 29/40* (2006.01)

(52) U.S. Cl.
USPC ...... 257/783; 257/E23.04; 257/779; 257/782; 438/118

(58) Field of Classification Search
CPC .............................. H01L 23/488; H01L 21/60
USPC ............ 257/E23.04, 772, 779, 703, 723–725, 257/782, 783, E21.509, E23.023; 438/107–110, 118; 420/555
See application file for complete search history.

(56) References Cited

U.S. PATENT DOCUMENTS

| | | | | |
|---|---|---|---|---|
| 5,241,133 A | * | 8/1993 | Mullen et al. | 174/534 |
| 5,590,462 A | * | 1/1997 | Hundt et al. | 29/840 |
| 5,709,338 A | * | 1/1998 | Shirai et al. | 228/226 |
| 5,990,545 A | * | 11/1999 | Schueller et al. | 257/697 |
| 6,740,544 B2 | * | 5/2004 | Strouse et al. | 438/118 |
| 6,919,645 B2 | * | 7/2005 | Tian et al. | 257/787 |
| 7,722,962 B2 | * | 5/2010 | Soga et al. | 428/620 |
| 7,825,524 B2 | * | 11/2010 | Doering et al. | 257/786 |
| 2005/0199987 A1 | * | 9/2005 | Danno et al. | 257/672 |

* cited by examiner

*Primary Examiner* — Chris Chu
(74) *Attorney, Agent, or Firm* — Novak Druce Connolly Bove + Quigg LLP

(57) ABSTRACT

A chip package includes a PCB, a connecting pad fixed on a surface of the PCB and a chip fixed on the connecting pad. The connecting pad includes a first metal film on its surface facing away from the PCB. The chip includes a second metal film formed on its surface opposite to the PCB. The first and the second metal are connected to each other via a eutectic manner.

4 Claims, 3 Drawing Sheets

CHIP PACKAGE AND METHOD FOR ASSEMBLING CHIP PACKAGE

BACKGROUND

1. Technical Field

The present disclosure relates to a chip package and a method for assembling the chip package.

2. Description of Related Art

Chip packages may include a printed circuit board (PCB) and a chip. The PCB is configured to form a connecting pad. The chip is positioned on the PCB, precisely aligned with the connecting pad, and is fixed to the PCB via curable adhesive, thus electrically connecting to the PCB. However, the chip may slightly float away the connecting pad before the curable adhesive is cured, degrading a connecting quality of the chip package.

What is needed therefore is a chip package and a method for assembling the chip package addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
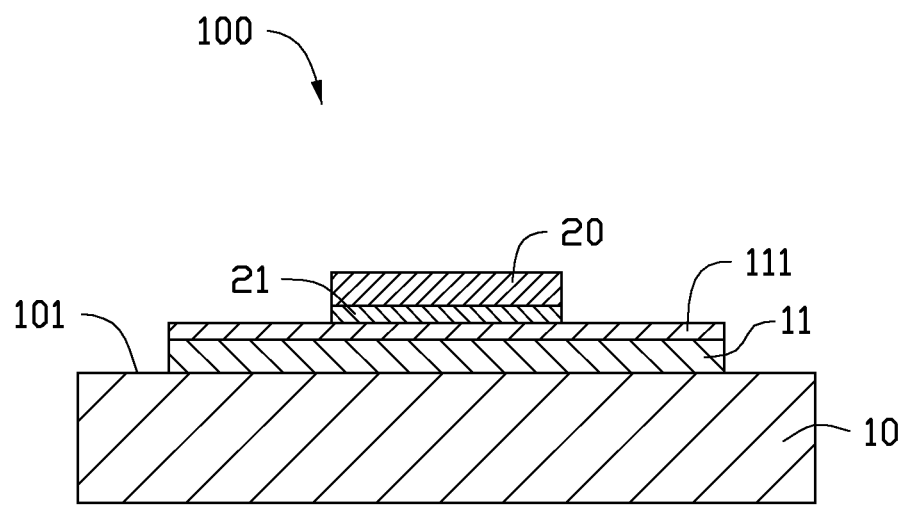
FIG. 1 is a schematic view of a chip package, according to a first exemplary embodiment of the present disclosure.

FIG. 1, is a chip package 100, according to a first exemplary embodiment. The chip package 100 includes a PCB 10 and a chip 20 positioned on the PCB 10.

The PCB 10 includes a mounting surface 101 and a connecting pad 11 formed on the mounting surface 101. The connecting pad 11 includes a first metal film 111. The metal film 111 is formed on a surface of the connecting pad 11 away from the PCB 10.

The chip 20 includes a second metal film 21 formed on a surface opposite to the PCB 10. The first metal film 11 and the second metal film 21 are connected to each other via a eutectic manner. Thus, the chip 21 is securely connected to the PCB 10.

A material of the first metal film 11 and the second metal film 21 can be one or more alloys of Au—Sn, Sn—Sb, Sn—Ag, Sn—Pb, In—Ag, In—Sn and Sn—Ag—Cu. The first metal film 11 and the second metal film 21 can be formed using a vacuum evaporating method or a magnetron sputtering method.

Figure 2:
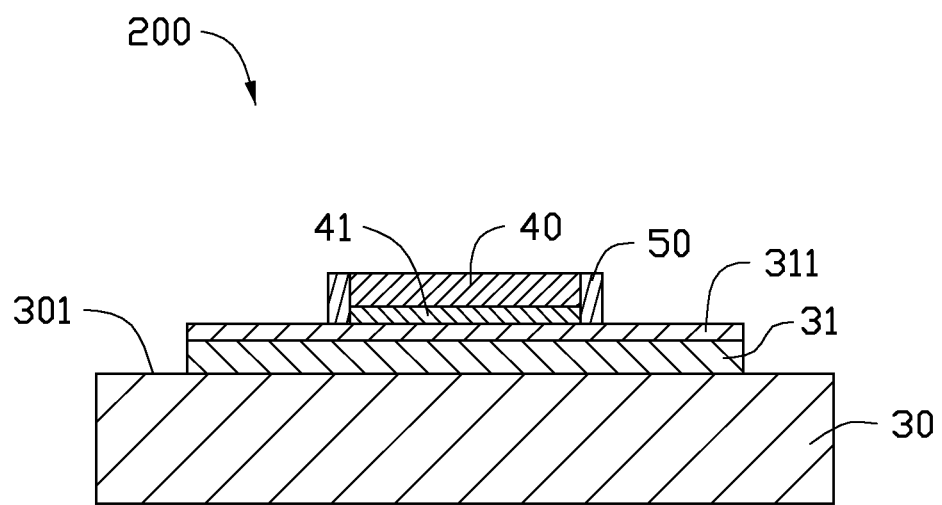
FIG. 2 is a schematic view of a chip package, according to a second exemplary embodiment of the present disclosure.

FIG. 2, is a chip package 200, according to a second exemplary embodiment. Similar to the chip package 100 of the first embodiment, the chip package 200 includes a PCB 30 and a chip 40 positioned on the PCB 30. The PCB 30 includes a mounting surface 301 and a connecting pad 31 formed on the mounting surface 301. The connecting pad 31 includes a first metal film 311 formed on a surface away from the PCB 30. The chip 40 includes a second metal film 41 formed on a surface opposite to PCB 30. The first metal film 311 and the second metal film 41 are connected to each other via a eutectic manner.

In addition, the chip package 200 includes an adhesive portion 50 formed on the connecting pad 31 surrounding the chip 40. The adhesive portion 50 securely connects the chip 40 to the first metal film 311. As such, an adhesive force of the chip 40 on the PCB 30 is enhanced. In this embodiment, the adhesive portion 50 is ultraviolet (UV) curable glue.

Figure 3:
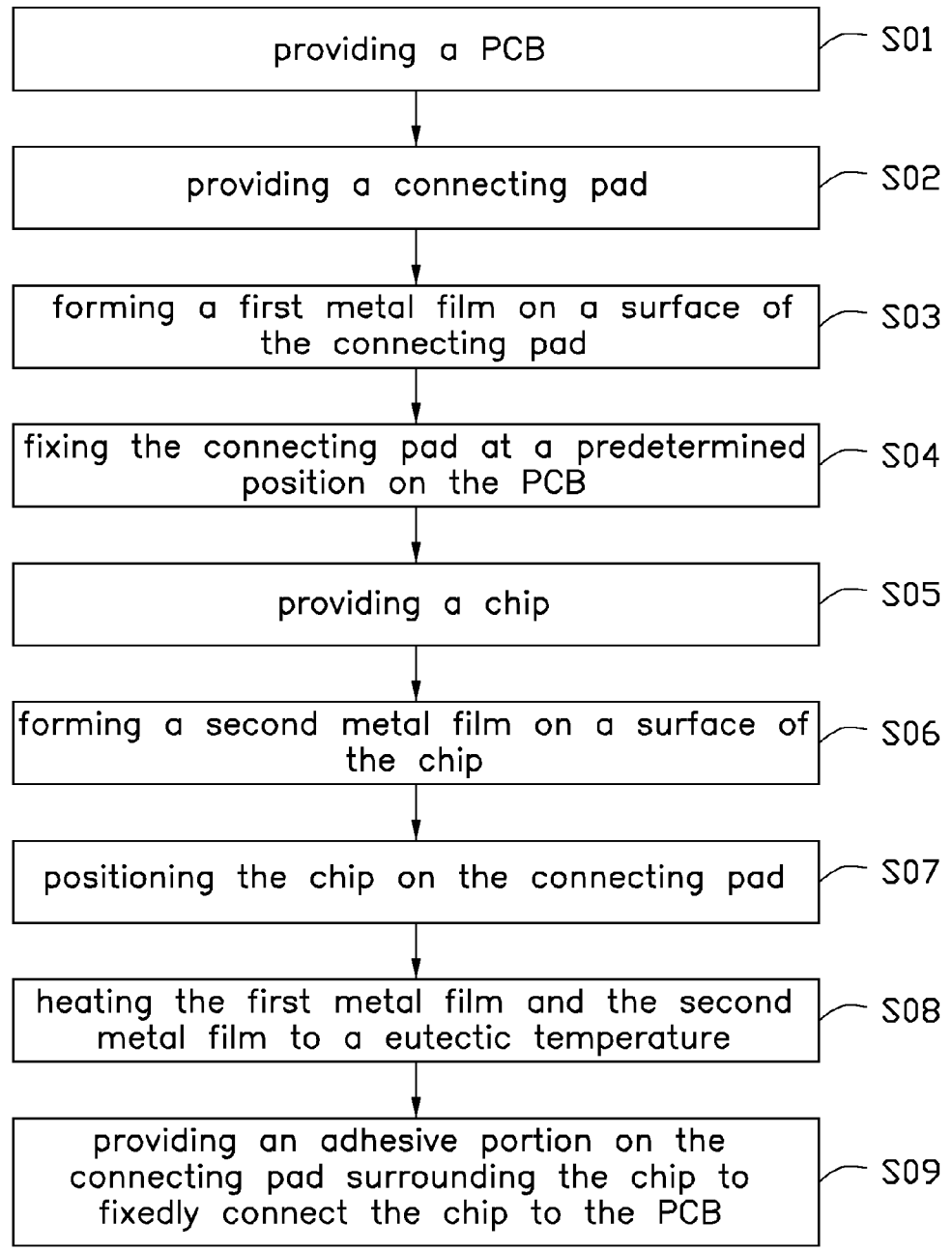
FIG. 3 a flowchart of a method for assembling a chip package, according to a third embodiment of the present disclosure.

Referring to FIG. 3, is a flowchart of a chip assembling method of a third exemplary embodiment. The chip assembling method includes the following steps.

In step S01, a PCB is provided.

In step S02, a connecting pad is provided.

In step S03, a first metal film is formed on a surface of the connecting pad.

In step S04, the connecting pad is fastened at a predetermined position on the PCB, with the surface of the connecting pad with the first metal film facing away from the PCB.

In step S05, a chip is provided.

In step S06, a second metal film is formed on a surface of the chip.

In step S07, the chip is positioned on the connecting pad, with the first metal film directly touching the second metal film.

In step S08, the first metal film and the second metal film are heated to a eutectic temperature. Thus, the first metal film and the second metal film are connected to each other via a eutectic manner.

In step S09, an adhesive portion is provided on the connecting pad surrounding the chip. The adhesive portion securely connects the chip to the connecting pad. The adhesive portion is UV curable glue.

In the above steps, the material of the first metal film and the second metal film can be one or more of alloy of Au—Sn, Sn—Sb, Sn—Ag, Sn—Pb, In—Ag, In—Sn and Sn—Ag—Cu. The first metal film and the second metal film can be formed using a vacuum evaporating method or a magnetron sputtering method. And the first metal film and the second metal film can be heated to the eutectic temperature by a laser apparatus.

According to different material of the first metal film and the second metal film, the eutectic temperature is different. The eutectic temperatures of typically materials are listed in the following table.

| material (alloy) | eutectic temperature (° C.) |
| --- | --- |
| Au—Sn | 280 |
| Sn—Sb | 245 |
| Sn—Ag | 221 |
| Sn—Pb | 183 |
| In—Ag | 143 |
| In—Sn | 118 |
| Sn—Ag—Cu | 217 |

The chip package and the chip assembling method for the chip package using the first metal film and the second metal film to connect the chip to the PCB via a eutectic manner, therefore, the chip on the PCB will not float on the workpiece, and the mounting accuracy of the chip is ensured.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip package, comprising:
 a PCB comprising a surface;
 a connecting pad fixed on the surface of the PCB, the connecting pad comprising a first metal film on its surface facing away from the PCB;
 a chip comprising a second metal film on its surface opposite to the PCB, the first metal film and the second metal film connected to each other via a eutectic manner, and
 an adhesive portion on the connecting pad surrounding the chip, the adhesive portion fixedly connecting the chip to the first metal film.

2. The chip package of claim 1, wherein each of the first metal film and the second metal film is made of an alloy material selected from a group consisting of Au—Sn, Sn—Sb, Sn—Ag, Sn—Pb, In—Ag, In—Sn, and Sn—Ag—Cu.

3. The chip package of claim 1, wherein the fist metal film and the second metal film are formed using a vacuum evaporating method or a magnetron sputtering method.

4. The chip package of claim 1, wherein the adhesive portion is UV curable glue.

* * * * *